United States Patent [19]

Hayashi et al.

[11] Patent Number: 5,312,802
[45] Date of Patent: May 17, 1994

[54] OXIDE SUPERCONDUCTIVE WIRE, METHOD OF MANUFACTURING THE SAME AND THE PRODUCTS USING THE SAME

[75] Inventors: Noriki Hayashi; Satoshi Takano; Shigeru Okuda; Hajime Hitotsuyanagi, all of Osaka, Japan

[73] Assignee: Sumitomo Electric Industries, Ltd., Osaka, Japan

[21] Appl. No.: 613,868

[22] PCT Filed: Mar. 29, 1990

[86] PCT No.: PCT/JP90/00422
§ 371 Date: Nov. 29, 1990
§ 102(e) Date: Nov. 29, 1990

[87] PCT Pub. No.: WO90/12408
PCT Pub. Date: Oct. 18, 1990

[30] Foreign Application Priority Data
Mar. 31, 1989 [JP] Japan .................................. 1-82556
Jul. 14, 1989 [JP] Japan ................................. 1-183207
Mar. 9, 1990 [JP] Japan .................................. 2-58814

[51] Int. Cl.$^5$ ......................... H01F 7/22; H01B 12/02
[52] U.S. Cl. ................................ 505/211; 174/125.1; 335/216; 505/700; 505/704; 505/705; 505/230
[58] Field of Search ..................... 335/216; 174/125.1; 505/704, 700, 705, 879, 1

[56] References Cited
U.S. PATENT DOCUMENTS
5,168,127 12/1992 Kohno et al. .................... 174/125.1

FOREIGN PATENT DOCUMENTS
0312015 4/1989 European Pat. Off. .
0357910 3/1990 European Pat. Off. .

OTHER PUBLICATIONS

T. Konaka et al.: "Preparation of Y-Ba-Cu-O Superconducting Tape by Atmospheric Plasma Spraying", Japanese Journal of Applied Physics Letters vol. 27, No. 6, Jun. 1988, Tokyo, JP pp. 1092-1093.
Patent Abstracts of Japan vol. 13, No. 99 (E-724) Mar. 8, 1989 & JP-A-63 274017.
IBM Technical Disclosure Bulletin "Superconducting ceramic-metal structure" vol. 32, No. 4B, Sep. 1989, New York, US pp. 85-86.
Patent Abstracts of Japan vol. 13, No. 254 (E-772) Jun. 13, 1989 & JP-A-1052327.

Primary Examiner—Leo P. Picard
Assistant Examiner—R. Barrera

[57] ABSTRACT

An oxide superconductive wire is provided by, for example, forming an oxide superconductive layer on a tape-type flexible base. A preliminary compressive strain is applied to the oxide superconductive layer in the longitudinal direction. The remaining strain can be provided by using a base having thermal expansion coefficient larger than that of the oxide superconductive layer and by cooling the same after heat treatment, due to contraction of the base. Since the preliminary compressive strain is applied to the oxide superconductive layer, degradation of superconductivity of the oxide superconductive layer can be suppressed even if the oxide superconductive wire is bent in any direction, compared with the wire without such strain. Therefore, the oxide superconductive wire can be coiled, for example, without much degrading the superconductivity.

3 Claims, 5 Drawing Sheets

OXIDE SUPERCONDUCTIVE WIRE, METHOD OF MANUFACTURING THE SAME AND THE PRODUCTS USING THE SAME

TECHNICAL FIELD

The present invention relates to oxide superconductive wires, a method of manufacturing oxide superconductive wires and products using the oxide superconductive wires. More specifically, the present invention relates to an improvement for preventing, when an oxide superconductive wire is bent, degradation of superconductivity caused by the bending.

BACKGROUND ART

Metal superconductors, compound superconductors and oxide superconductors have been known and various applications thereof have been studied. A superconductor has its electrical resistance made zero when it is maintained at a temperature not higher than a critical temperature. Generation of high magnetic field, high density transfer of large current and so on have been tried utilizing this characteristic.

Recently, attention is beginning to center on oxide superconductive materials, which have higher critical temperature at which the superconductive phenomenon occurs. Such superconductive materials can be used for power transmission and distribution, electrical connection between various equipment and elements, AC coils and so on, when they are turned into longitudinal wire bodies.

Various methods have been known to fabricate wires of oxide superconductive materials. In one method, powder of oxide superconductive material is filled in a metal pipe and the cross section thereof is reduced. In another, a layer of oxide superconductive material is formed on a longitudinal base. Gas phase thin film deposition such as vapor deposition, sputtering and CVD may be applied as a method of forming the oxide superconductive layer.

Generally, oxide superconductive materials are weak on strain, especially tensile strain, and when a tensile strain is generated, for example, superconductivity such as critical temperature and current density is significantly degraded. When a longitudinal oxide superconductive wire is bent, a tensile strain is generated in some portion or other inevitably. In order to lengthen the oxide superconductor while suppressing generation of strain such as the tensile strain as much as possible, a method of forming a thin oxide superconductive layer on a fiber-type or film-type thin or narrow flexible base has been known. By this method, the wire can be bent to be have smaller diameter with the same allowable strain.

However, there is a limit in the above described method, and oxide superconductive wires which are stronger against strain have been desired for practical use.

Therefore, an object of the present invention is to provide oxide superconductive wires which are stronger against strains.

Another object of the present invention is to provide a method of manufacturing the above described oxide superconductive wires which are stronger against strains.

A further object of the present invention is to provide products using the above described oxide superconductive wires.

DISCLOSURE OF THE INVENTION

The inventors of the present invention have found that the oxide superconductor is weak on tensile strain but relatively strong against compressive strain, and the inventors have attained the present invention based on this finding.

The oxide superconductive wire in accordance with the present invention has an oxide superconductive layer formed on a longitudinal flexible base, wherein the compressive strain is remained in the oxide superconductive layer in the longitudinal direction to solve the above described technical problem.

The base used in the present invention is, typically, a tape-type or fiber-type base.

Y-Ba-Cu-O, Bi-Sr-Ca-Cu-O, Bi-Pb-Sr-Ca-Cu-O, Tl-Ba-Ca-Cu-O, Tl-Pb-Ba-Ca-Cu-O and other materials are used as the oxide superconductive materials for forming the oxide superconductive layer in the present invention. Any of these materials exhibits superconductivity by heat treatment at 400° to 1000° C. In the present invention, the above mentioned step of heat treatment and a succeeding step of cooling can be advantageously used to provide preliminary strain of compression on the oxide superconductive layer.

In the oxide superconductive wire having an oxide superconductive layer formed on a base by painting or gas phase deposition, which may have a stabilizing layer and a protective layer formed in addition to the oxide superconductive layer, the cross sectional area of the base is the largest among those of the oxide superconductive layer, the stabilizing layer and protective layer. Therefore, the strain in the oxide superconductive layer is applied by physical action derived from expansion or contraction of the base itself, such as thermal expansion of the base or contraction which occurs when the base is heated or cooled. In this manner, the preliminary compressive strain applied to the oxide superconductive layer is from the base, and such remaining strain is typically applied by the following to third methods. The first to third methods will be described with reference to the figures.

FIG. 1 shows the first method. An oxide superconductive layer 1 formed on a base 2 is heat treated and then cooled. At this time, if there is a relation $\alpha_1 < \alpha_2$ between the thermal expansion coefficient $\alpha_1$ of the oxide superconductive layer 1 and the thermal expansion coefficient $\alpha_2$ of the base 2, the preliminary compressive strain is applied to the oxide superconductive layer 1 as shown by an arrow 3 during cooling after heat treatment.

Materials of the base 2 satisfying the above mentioned relation $\alpha_1 < \alpha_2$ comprise zinc, aluminum, indium, silver, tin, lead, aluminum alloy, and copper alloy.

FIG. 2 shows the second method. A tensile stress is applied as shown by arrows 4a and 4b to the oxide superconductive layer 1 as well as to the base 2.

Consequently, a tensile strain is applied to the oxide superconductive layer 1 and the base 2 as shown by arrows 5 and 6. Heat treatment is carried out in this state. By the heat treatment, only the tensile strain in the oxide superconductive layer 1 is released. In order to enable release of the strain only in the superconductive layer, a material such as yttria stabilized zirconia (YSZ) or alumina must be used as the material of the base 2, whose tensile strain is not released under the heat treatment condition applied to the oxide superconductive layer. Then the preliminary compressive strain is applied to the oxide superconductive layer 1 as shown by an arrow 7 when it is cooled.

FIG. 3 shows the third method. The oxide superconductive layer 1 together with the base 2 are bent with the superconductive layer positioned outside. Consequently, a tensile strain is applied to the oxide superconductive layer 1 as shown by an arrow 8. A relative tensile strain is applied as shown by an arrow 9 on the outer circumferential surface of the base 2, and a relative compressive strain is applied as shown by an arrow 10 in the inner side. Then heat treatment is carried out in this state, and only the stress existing in the oxide superconductive layer 1 is released. Then the base and the superconductive layer are unbent, so that a preliminary compressive strain is applied as shown by an arrow 11 to the oxide superconductive layer 1.

A tape-type base 2 may be preferably used when the third method is employed.

In the third method shown in FIG. 3, the stress existing in the base 2 as well may be released during heat treatment.

In the first to third methods described above, the preliminary compressive strain is applied from the base 2 to the oxide superconductive layer 1. However, if a stabilizing layer is formed on the oxide superconductive layer 1, the preliminary compressive strain may be applied from the stabilizing layer to the oxide superconductive layer. This will be described with reference to FIG. 4.

Referring to FIG. 4, an oxide superconductive layer 13 is formed on a base 12, and a stabilizing layer 14 is formed on the oxide superconductive layer 13. When the stabilizing layer 14 is formed, heating at a temperature of, for example, 400° C. to 1000° C. is carried out. At this time, if there is a relation $\alpha 13 < \alpha 14$ between the thermal expansion coefficient $\alpha 13$ of the oxide superconductive layer 13 and the thermal expansion coefficient $\alpha 14$ of the stabilizing layer 14, a preliminary compressive strain is applied at least on a surface of the oxide superconductive layer 13, based on the contraction of the stabilizing layer 14 during cooling after the heat treatment. Materials of the stabilizing layer 14 satisfying the relation $\alpha 13 < \alpha 14$ of the thermal expansion coefficients comprise zinc, aluminum, indium, silver, tin, lead, copper, and aluminum alloy.

In accordance with the above method, the preliminary compressive strain can be applied to the oxide superconductive layer 13 regardless of the relation between the thermal expansion coefficient $\alpha 13$ of the oxide superconductive layer 13 and the thermal expansion coefficient $\alpha 12$ of the base 12. Therefore, if there is a relation $\alpha 13 > \alpha 12$, the method of applying the compressive strain from the stabilizing layer 14 is especially effective.

Further, the present invention provides products using the above described oxide superconductive wires. In the products, the oxide superconductive wire having an oxide superconductive layer formed on one surface of a longitudinal flexible base is bent with the oxide superconductive layer positioned outside and a base positioned inside about the flexural center.

Coils using the oxide superconductive wires, bobbins around which the oxide superconductive wire is wound, cables having the oxide superconductive wire wound spirally on the surface of a longitudinal body, are the examples of the above mentioned products.

In the oxide superconductive wire according to the present invention, the oxide superconductive layer included therein has a preliminary compressive strain in the longitudinal direction. When such an oxide superconductive wire is bent, the preliminary compressive strain is either released or further increased. When the compressive strain of the oxide superconductive layer is released, the factor affecting the superconductivity is reduced, so that degradation of the superconductivity generated when the oxide superconductive wire is bent can be prevented. Even if the compressive strain is further increased, the oxide superconductive layer is relatively strong against compressive strain compared with the tensile strain, and therefore the superconductivity is not very much degraded.

Therefore, the oxide superconductive wire in accordance with the present invention can be bent without much degrading the superconductivity when it is coiled, either in the direction releasing the compressive remaining strain or in a direction further increasing the compressive strain. Therefore, treatment of the oxide superconductive wire can be facilitated.

As described above, according to the present invention, oxide superconductive wires strong against bending can be provided, which are readily used for various magnets, coils, cables and the like.

The oxide superconductive wire in accordance with the present invention can be coiled after heat treatment. Conversely, if heat treatment is to be done after coiling, it is necessary that a bobbin or an insulating layer must be formed of a material which can withstand heat treatment. For the oxide superconductive wire of the present invention, bobbins formed of aluminum alloy, FRP or the like may be used, and common enamel insulation is available.

In the method of manufacturing an oxide superconductive wire in accordance with the present invention, the preliminary compressive strain can be easily applied in the longitudinal direction of the oxide superconductive layer, advantageously utilizing the steps of heat treatment necessary for forming the oxide superconductive layer and the succeeding cooling.

In the product using an oxide superconductive wire in accordance with the present invention, an oxide superconductive wire having an oxide superconductive layer formed on one surface of a flexible base with a preliminary compressive strain applied in the longitudinal direction of the oxide superconductive layer is employed. Such an oxide superconductive wire is bent with the oxide superconductive layer positioned outside and the base positioned inside about the flexural center. Therefore, a tensile stress, if any, is applied to the oxide superconductive layer. However, such a tensile stress is merely to release the compressive strain which has been applied to the oxide superconductive layer, and therefore influence of the tensile strain, which is undesirable to the oxide superconductive layer, can be prevented more or less. Therefore, degradation of superconductivity of the oxide superconductive layer included in the oxide superconductive wire can be prevented.

Consequently, in products such as coils and cables and intermediate products such as bobbins using the oxide superconductive wires in the above described manner, the superconductivity of the oxide superconductive wires can be fully utilized. For example, in a compact magnet for investigation, the oxide superconductive wire must be bent to have a radius of curvature as small as about 2 to 3 cm, for example. The oxide superconductive wire of the present invention can be applied to such usage without problem. In addition, according to the present invention, a cable formed by winding an oxide superconductive wire spirally around a surface of a longitudinal body such as a pipe can be provided. In the case of such a cable, the longitudinal body such as the pipe can give rigid structure, and therefore the oxide superconductive wire is not necessarily be very rigid.

As described above, bobbins on which the oxide superconductive wires are simply wound are included in the products using the oxide superconductive wires according to the present invention. The oxide superconductive wire wound around a bobbin is used in a preparatory step for the succeeding processing such as enamel painting of the oxide superconductive wire, or in the step of forwarding the oxide superconductive wire. The condition of winding the oxide superconductive wire, that is, the direction of bending is taken into consideration not only in the final products such as coils and cables but also in the intermediate products such as bobbins from the following reasons. More specifically, if the tensile strain applied to the oxide superconductive layer exceeds a prescribed magnitude, the superconductivity provided before the application of the tensile strain can not be recovered even if the tensile strain is removed. Therefore, it is important to treat the intermediate products such that the tensile strain higher than the prescribed magnitude is not applied to the oxide superconductive layer, even if the intermediate product itself is not set in the superconductive state.

BEST MODES FOR CARRYING OUT THE INVENTION

Embodiment 1

Figure 4:
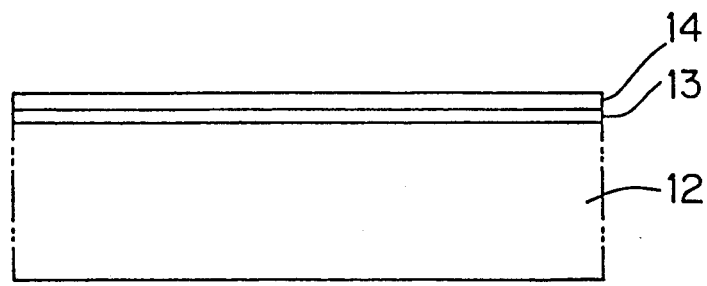
FIG. 4 is a vertical sectional view showing an oxide superconductive wire provided by Embodiment 1 or 5 of the present invention.

Referring to FIG. 4, an oxide superconductive layer 13 is formed on a tape-type base 12, and a stabilizing layer 14 of copper is formed thereon.

More specific method of formation of the oxide superconductive layer 13 is as follows.

A superconductive layer 13 of $Y_1Ba_2Cu_3O_{7-\delta}$ having the thickness of 2 μm was formed by laser deposition on a tape-type base 12 of YSZ (9% $Y_2O_3$ added) having the thickness of 50 μm. The conditions of film formation are as follows.

Figure 3:
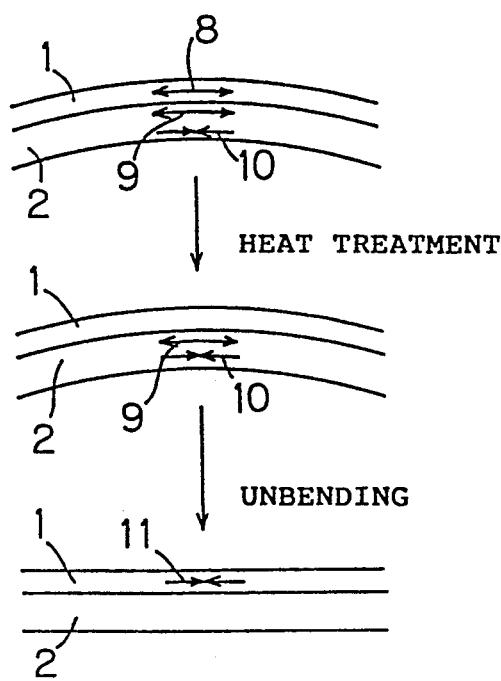

Target composition: $Y_1Ba_2Cu_3O_{7-\delta}$
Base temperature: 720° C.
Laser peak output: 2 J
Laser pulse width: 15 ns
Laser frequency: 10 Hz
$O_2$ pressure: 0.01 Torr Then heat treatment at 950° C. in $O_2$ atmosphere was carried out for 1 hour with 0.1% tensile strain applied to the oxide superconductive layer 13, like the oxide superconductive layer 1 of FIG. 3. After heat treatment, strain characteristic of the critical current density Jc (77.3K) was measured. According to the result of measurement, degradation by more than 10% of Jc was not exhibited until the oxide superconductive wire was bent to the diameter of 40 mm, no matter to which side the wire was bent. According to detailed examination of the strain characteristic of the provided oxide superconductive wire, degradation of Jc was smaller than 5% when the oxide superconductive wire was bent to have the diameter of 40 mm with the oxide superconductive layer 13 positioned outside and the base 12 positioned inside about the flexural center, while degradation of Jc was 5 to 10% when the wire was bent in the opposite direction.

REFERENCE EXAMPLE 1

Heat treatment under the same condition as in Embodiment 1 was carried out of the oxide superconductive layer, without applying the tensile strain. When the oxide superconductive wire provided in this manner was bent to the diameter of 40 mm with the oxide superconductive layer made concave, degradation of Jc was 8%. When it was bent in the opposite direction, degradation was 90% or more.

Embodiment 2

Figure 5:
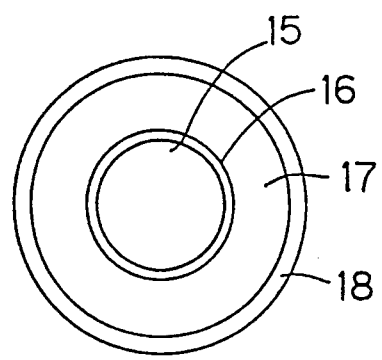
FIG. 5 is a cross sectional view of an oxide superconductive wire provided by Embodiment 2 or 6 of the present invention.

Referring to FIG. 5, on a central fiber 15 of alumina, an intermediate layer 16 of MgO for preventing diffusion was formed, then an oxide superconductive layer 17 was formed thereon, and a stabilizing layer 18 of copper was further formed thereon.

More specifically, $Bi_2O_3$, PbO, $SrCO_3$, $CaCO_3$, and CuO were weighed to have the proportion Bi:Pb:Sr:Ca:Cu=1.7:0.4:2:2:3, calcined for 12 hours at 830° C., and milled to be used as material powder.

The material powder and polyvinyl alcohol were mixed with weight proportion being 1:1. A base prepared by the central fiber 15 of alumina having the diameter of 100 μm and an intermediate layer 16 of MgO of 1 μm formed thereon was dipped in the above mixture, and it was fired for 3 hours at 860° C. A stabilizing layer 18 of copper of 3 μm was formed thereon by vapor deposition to obtain the an oxide superconductive wire. The stabilizing layer 18 may be formed of aluminum.

Figure 1:
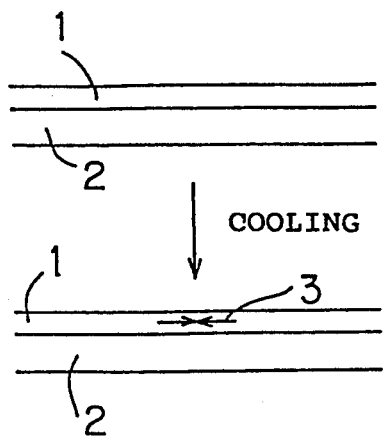
FIGS. 1 to 3 show methods of applying preliminary compressive strain to an oxide superconductive layer, respectively.
Figure 2:
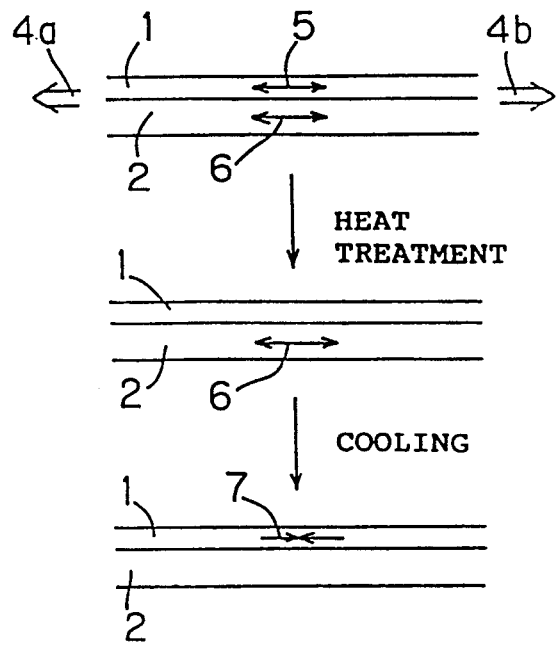

The wire formed with 0.1% tensile strain applied during firing as shown in FIG. 2 exhibited the degradation of Jc not higher than 10% even when it was bent to the diameter of 100 mm.

REFERENCE EXAMPLE 2

In Embodiment 2, the wire formed without applying the tensile strain exhibited the degradation of Jc as high as 90% or more when it was bent to the diameter of 200 mm.

Embodiment 3

A film of Y-Ba-Cu-O superconductive material was formed to be 1 μm in thickness by laser deposition on a base (5 mm in width, 0.1 mm in thickness) of silver with platinum deposited to be 0.1 μm thereon as a diffusion preventing layer. The conditions of film formation were as follows.

Target composition: $Y_1 Ba_2 Cu_3 O_x$
Film forming temperature: 750° C.
Gas pressure: 0.1 Torr
Gas $O_2$
Laser wave length: 193 nm
Energy density: 1 J/cm$^2$ After the film is formed in this manner, the provided oxide superconductive wire was heat treated for 10 minutes at 900° C. in a heat treatment chamber, with the speed of movement of the base being 4 cm/hour.

Figure 6:
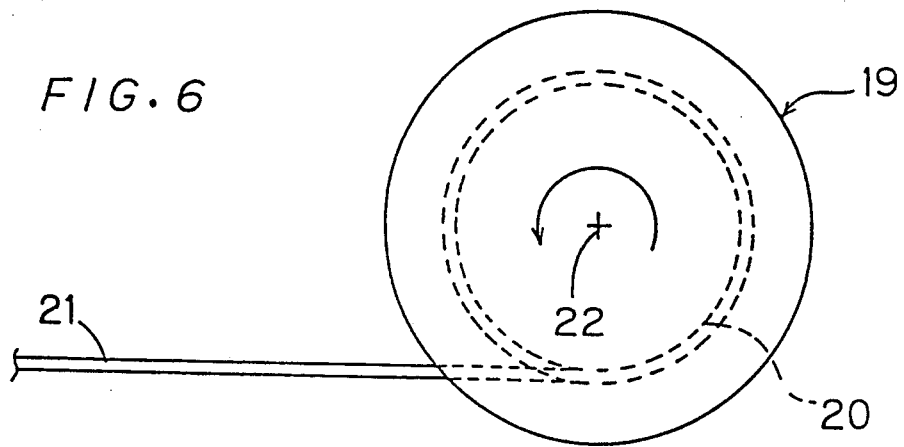
FIG. 6 is a front view showing a bobbin 19 on which an oxide superconductive wire 21 is wound in Embodiment 3 of the present invention.
Figure 7:
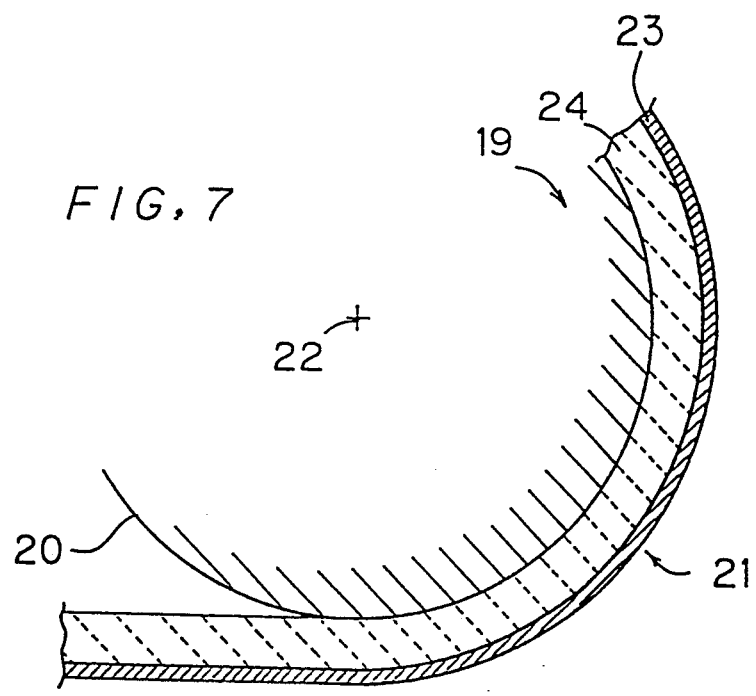
FIG. 7 is an enlarged cross sectional view showing the oxide superconductive wire 21 wound around a core 20 of the bobbin 19 shown in FIG. 6.

Then, in a winding chamber, the oxide superconductive wire 21 was wound for 5 turns on a core 20 of a bobbin 19 as shown in FIGS. 6 and 7. At this time, the oxide superconductive wire 21 was wound with the oxide superconductive layer 23 positioned outside and the base 24 positioned inside about the center of the core 20, that is, the flexural center 22, as shown in FIG. 7. The diameter of the core 20 was 40 mm.

By the time of the above described step of winding, the heat-treated oxide superconductive wire 21 was cooled, and since the thermal expansion coefficient of the base 24 was larger than that of the oxide superconductive layer 23, a preliminary compressive strain was applied in the longitudinal direction of the oxide superconductive layer 23.

The oxide superconductive wire 21 wound around the bobbin 19 was dipped in liquid nitrogen and the critical current was measured, which was 5.5 A.

When the oxide superconductive wire provided by Embodiment 3 was cut in an appropriate length without winding, and the critical current in liquid nitrogen of the linear wire was measured, which was 6.0 A.

REFERENCE EXAMPLE 3

The oxide superconductive wire 21 was wound around the core 20 of the bobbin 19 under the same condition as in Embodiment 3 except that the oxide superconductive layer 23 was positioned inside. The critical current of the oxide superconductive wire 21 wound around the bobbin 19 was measured under the same condition, which was 4.75 A.

Embodiment 4

An oxide superconductive wire was provided by using the same base and the same film forming conditions as in Embodiment 3. By using the oxide superconductive wire, a superconductive coil was fabricated as will be described below.

Figure 8:
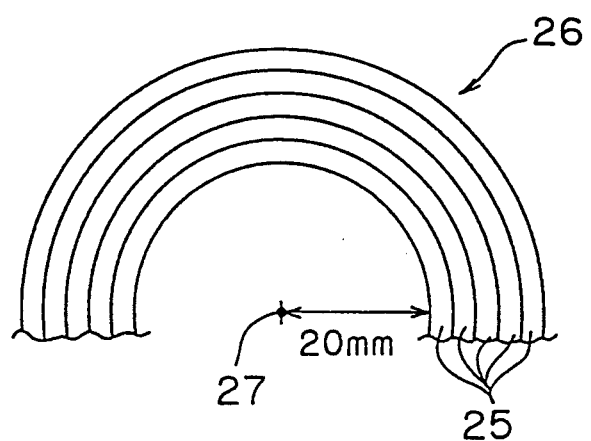
FIG. 8 is a front view showing a portion of a coil 26 provided by Embodiment 4 of the present invention.
Figure 9:
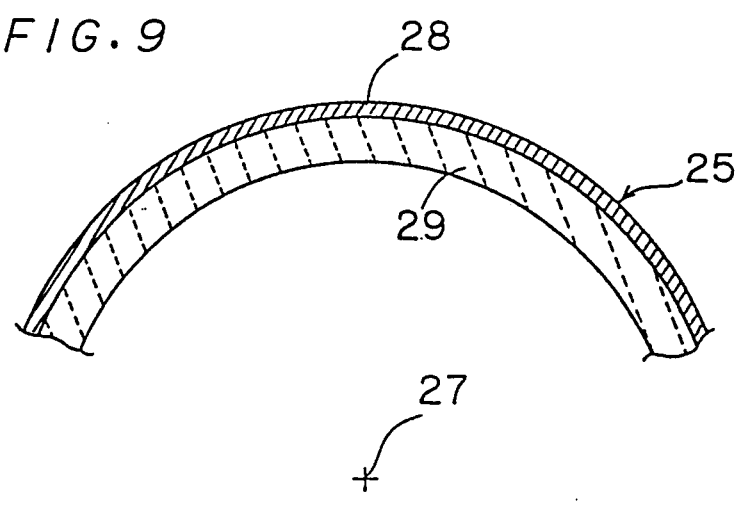
FIG. 9 is a cross sectional view showing in enlargement a portion of an oxide superconductive wire 25 included in the coil 26 shown in FIG. 8.

Referring to FIG. 8, an oxide superconductive wire 25 was wound for 5 layers to provide a coil 26, starting from a circumference distant from the center 27 of the coil 26 by the radius of 20 mm. At this time, the oxide superconductive wire was wound with the oxide superconductive layer 28 positioned outside and the base 29 positioned inside.

The coil 26 provided in this manner was dipped in liquid nitrogen, and the critical current was measured, which was 25 A.

REFERENCE EXAMPLE 4

A coil was fabricated under the same condition as in Embodiment 4 except that the wire was wound with the oxide superconductive layer 28 positioned inside. The critical current was measured under the same condition, which value was 8.8 A.

Embodiment 5

Referring to FIG. 4, an oxide superconductive layer 13 was formed on a base 12 of silver having the thickness of 50 μm and the width of 5 mm, and a stabilizing layer 14 was formed thereon. The specific method of forming the oxide superconductive layer 13 and the stabilizing layer 14 was as follows.

The oxide superconductive layer 13 of $Y_1Ba_2Cu_3O_x$ of 1 μm in thickness was formed by laser deposition on the base 12. The conditions of film formation were as follows.

Target composition: $Y_1Ba_2Cu_3O_x$
Base temperature: 600° C.
Laser peak output: 1 J
Laser pulse width: 10 ns
Laser frequency: 10 Hz
Gas pressure: 0.1 Torr Then, the base 12 on which the oxide superconductive layer 13 was formed was moved to a separate film forming chamber and cooled to 400° C. In this state, silver was deposited to the thickness of 0.2 μm by laser deposition to form a stabilizing layer 14.

The oxide superconductive wire provided in this manner was taken out of the film forming chamber, and strain dependency of the critical current density in the liquid nitrogen was measured. When the oxide superconductive wire provided in this manner was bent to have the diameter of 40 mm with the oxide superconductive layer 13 positioned outside of the base 12, the degradation of Jc was smaller than 3%.

REFERENCE EXAMPLE 5

Reference Example 5 is in the scope of the present invention. This example is to confirm the effect of Embodiment 5 described above.

More specifically, an oxide superconductive wire was formed under the same condition as in Embodiment 5 except that the stabilizing layer was not provided, and the strain dependency of Jc was measured. When the wire was bent to the diameter of 40 mm with the oxide superconductive layer positioned outside of the base, degradation of Jc was smaller than 5%.

Embodiment 6

Referring to FIG. 5, on a central fiber of alumina, an intermediate layer 16 of MgO for preventing diffusion was formed, then an oxide superconductive layer 17 was formed thereon, and further a stabilizing layer 18 of silver was formed thereon.

More specifically, a mixture of oxides having the composition of Bi:Pb:Sr:Ca:Cu=1.8:0.4:2:2:3 was fired and milled to be used as a material powder.

The material powder and polyvinyl alcohol were mixed with the weight proportion being 1:1. A base having a central fiber 15 of alumina having the diameter of 100 μm with an intermediate layer 16 of MgO of 1 μm in thickness formed thereon was dipped in the above mixture and fired for 3 hours at 860° C. Then, while the resulting body was heated to 400° C., a stabilizing layer 18 of silver having the thickness of 3 μm was formed by vapor deposition to provide an oxide superconductive wire.

The strain dependency of the critical current density in liquid nitrogen of the provided oxide superconductive wire was measured. When the oxide superconductive wire was bent to have the diameter of 100 mm, the degradation of Jc was not more than 30%, compared with the wire which was not bent.

REFERENCE EXAMPLE 6

In Embodiment 6 described above, when the wire without the stabilizing layer was bent to the diameter of 200 mm, degradation of Jc was 90% or more.

From the comparison between Embodiment 6 and Reference Example 6, it is understood that the preliminary compressive strain has significant effect, even if it is applied only to the surface layer of the oxide superconductive layer 13 as in Embodiment 6.

Embodiment 7

An oxide superconductive wire having a stabilizing layer of silver formed thereon was provided by using the same base under the same conditions of film formation as in Embodiment 5. The oxide superconductive wire was once wound around a bobbin, and then a superconductive coil was fabricated in the following manner.

Figure 10:
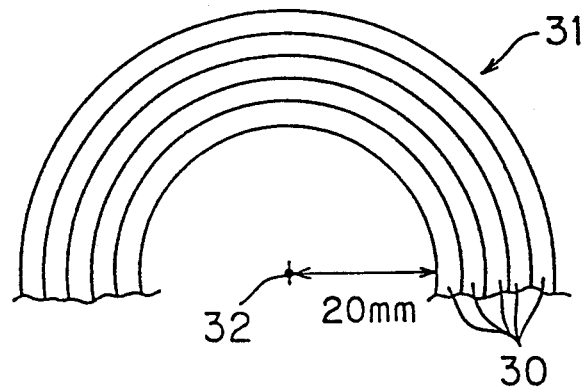
FIG. 10 is a front view showing a portion of a coil 31 provided by Embodiment 7 of the present invention.
Figure 11:
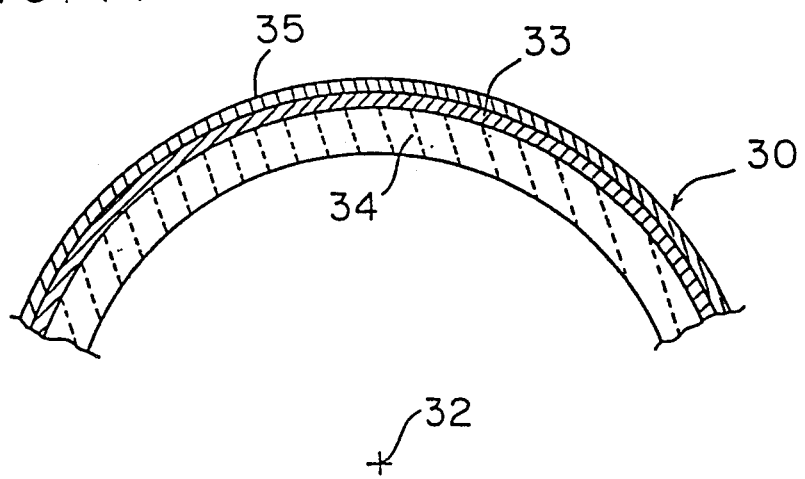
FIG. 11 is a cross sectional view showing in enlargement a portion of an oxide superconductive wire 30 included in the coil 31 shown in FIG. 10.

Referring to FIG. 10, the oxide superconductive wire 30 was wound to 5 layers to provide a coil 31 starting from a circumference distant from the center 32 of the coil 31 by the radius of 20 mm. At this time, the oxide superconductive wire 30 was wound with the oxide superconductive layer 33 positioned outside of the base 34 and the stabilizing layer 35 positioned on the outermost side, as shown in FIG. 11.

The coil 31 provided in this manner was dipped in liquid nitrogen and the critical current was measured, which was 29.2 A.

Further, the experiment was repeated for 50 times in liquid nitrogen and in room temperature, to find stability against heat cycle. The critical current value after 50 measurements was 28.8 A.

REFERENCE EXAMPLE 7

Reference Example 7 is in the scope of the present invention. This example is to confirm the effect of Embodiment 7.

A coil was fabricated under the same condition as in Embodiment 7 except that the silver stabilizing layer was not provided, and the critical current was measured under the same condition, which value was 25 A. In addition, stability against heat cycle between the liquid nitrogen and the room temperature was examined, and the critical current value after the repetition of the heat cycle for 50 times was 20 A.

INDUSTRIAL APPLICABILITY

As described above, the oxide superconductive wire in accordance with the present invention can be advantageously applied to products such as superconductive magnets for investigation, magnets for nuclear magnetic resonance diagnostic apparatus, superconductive cables, superconductive generators, superconductive transformers, superconductive coils for linear motor cars, superconductive coils for electromagnetically propelled ships, and to intermediate products such as the superconductive wires simply wound around bobbins.

We claim:

1. A product using an oxide superconductive tape or wire, said tape or wire comprising
   (a) a longitudinal flexible base, and
   (b) an oxide superconductive layer formed on one surface of the base, said surface being an outer surface upon bending, said oxide superconductive layer having a preliminary compressive strain in the longitudinal direction.

2. A product using an oxide superconductive tape or wire according to claim 1, wherein said product is a coil using said oxide superconductive tape or wire.

3. A product using an oxide superconductive tape or wire according to claim 1, wherein said product is a bobbin around which said oxide superconductive tape or wire is wound.

* * * * *